United States Patent
Park et al.

(10) Patent No.: US 10,915,139 B2
(45) Date of Patent: Feb. 9, 2021

(54) FOLDABLE DISPLAY

(71) Applicant: LG Display Co., Ltd., Seoul (KR)

(72) Inventors: Jin-Seo Park, Gimpo-si (KR); Jun-Hyung Kim, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/526,183

(22) Filed: Jul. 30, 2019

(65) Prior Publication Data
US 2020/0042042 A1  Feb. 6, 2020

(30) Foreign Application Priority Data
Jul. 31, 2018 (KR) .................. 10-2018-0089612

(51) Int. Cl.
*G06F 1/16* (2006.01)
*H01L 51/00* (2006.01)

(52) U.S. Cl.
CPC ........ *G06F 1/1616* (2013.01); *H01L 51/0097* (2013.01); *H01L 2251/5338* (2013.01)

(58) Field of Classification Search
CPC .... G06F 1/1616; G06F 1/1641; G06F 1/1683; G06F 1/1681; G06F 1/182; G06F 1/1615; G06F 1/1658; H01L 51/0097; H01L 2251/5338; H01L 27/3241; G09F 9/301; G09F 9/33

See application file for complete search history.

(56) References Cited

U.S. PATENT DOCUMENTS

| | | | | |
|---|---|---|---|---|
| 9,173,287 B1* | 10/2015 | Kim | ..................... | H05K 1/028 |
| 9,606,384 B2* | 3/2017 | Kim | .................. | G02F 1/133308 |
| 9,915,086 B2* | 3/2018 | Kato | ..................... | E05D 11/087 |
| 10,037,058 B2* | 7/2018 | Kato | ..................... | F16C 11/045 |
| 10,143,098 B1* | 11/2018 | Lee | ......................... | E05D 11/06 |
| 10,164,208 B2* | 12/2018 | Lee | ......................... | B32B 3/266 |
| 10,186,681 B2* | 1/2019 | Kang | .................. | H01L 51/0097 |
| 10,222,835 B2* | 3/2019 | Lim | ..................... | H04M 1/0214 |
| 10,437,293 B2* | 10/2019 | Bitz | ..................... | G06F 1/1616 |
| 10,481,640 B2* | 11/2019 | Kim | ....................... | G09F 9/301 |
| 10,599,183 B2* | 3/2020 | Magi | ..................... | G06F 1/1652 |
| 10,664,017 B2* | 5/2020 | Kim | .................. | H01L 51/0097 |

(Continued)

FOREIGN PATENT DOCUMENTS

EP  2 728 432 A1  11/2012
JP  2004-198472 A  7/2004

(Continued)

*Primary Examiner* — Adrian S Wilson
*Assistant Examiner* — Theron S Milliser
(74) *Attorney, Agent, or Firm* — Seed IP Law Group LLP

(57) ABSTRACT

A foldable display is disclosed. The foldable display includes a lower plate having a folding region abutted by unfolding regions. The foldable display includes a display panel on the lower plate which includes LED arrays so as to display images on all of the folding region and the unfolding regions. The lower plate includes first connection holes and second connection holes through which the display panel is connected to a printed circuit board on the lower plate. A hinge is coupled to the lower plate and includes hinge bodies and hinge links coupled together and configured to rotate such that the foldable display is manipulatable between a folded state and an unfolded state through a predetermined rotation path.

19 Claims, 12 Drawing Sheets

(56) References Cited

U.S. PATENT DOCUMENTS

| | | | |
|---|---|---|---|
| 2003/0030595 A1* | 2/2003 | Radley-Smith | G06F 15/0216 345/1.3 |
| 2008/0055106 A1* | 3/2008 | Zhang | G09F 9/33 340/815.45 |
| 2009/0219225 A1* | 9/2009 | Cope | G09F 9/301 345/55 |
| 2012/0002357 A1* | 1/2012 | Auld | G09F 21/04 361/679.01 |
| 2014/0126133 A1* | 5/2014 | Griffin | G06F 1/1652 361/679.27 |
| 2014/0196254 A1* | 7/2014 | Song | E05D 3/14 16/302 |
| 2015/0077917 A1* | 3/2015 | Song | G06F 1/1652 361/679.27 |
| 2015/0089974 A1* | 4/2015 | Seo | A44C 5/0076 63/1.13 |
| 2016/0132076 A1* | 5/2016 | Bitz | H04M 1/022 361/679.27 |
| 2016/0299532 A1* | 10/2016 | Gheorghiu | E05D 11/0054 |
| 2016/0374228 A1* | 12/2016 | Park | H05K 7/16 |
| 2017/0023976 A1 | 1/2017 | Xin et al. | |
| 2017/0090523 A1* | 3/2017 | Tazbaz | G06F 1/1681 |
| 2017/0172002 A1 | 6/2017 | Huitema et al. | |
| 2017/0357289 A1 | 12/2017 | Ahn | |
| 2018/0049329 A1* | 2/2018 | Seo | H05K 5/0017 |
| 2018/0067519 A1* | 3/2018 | Tazbaz | E05D 7/12 |
| 2018/0124931 A1* | 5/2018 | Choi | G06F 1/1652 |
| 2018/0145269 A1* | 5/2018 | Myeong | H01L 51/0097 |
| 2018/0150107 A1* | 5/2018 | Lee | G06F 1/1681 |
| 2018/0341293 A1* | 11/2018 | Kim | G06F 1/1675 |
| 2019/0036068 A1* | 1/2019 | Kim | G06F 1/1601 |
| 2019/0196548 A1* | 6/2019 | Kim | G06F 1/1681 |
| 2020/0103941 A1* | 4/2020 | Lin | G06F 1/1641 |

FOREIGN PATENT DOCUMENTS

| | | |
|---|---|---|
| JP | 2006-72115 A | 3/2006 |
| JP | 2018-060201 A | 4/2018 |
| TW | 201417068 A | 5/2014 |
| TW | I530930 B | 4/2016 |
| WO | 2017/211115 A1 | 12/2017 |

* cited by examiner (a)

(b)

FOLDABLE DISPLAY

CROSS-REFERENCE TO RELATED APPLICATION

This application claims the benefit of Korean Patent Application No. 10-2018-0089612, filed on Jul. 31, 2018, which is hereby incorporated by reference, in its entirety.

BACKGROUND

Technical Field

The present disclosure relates to a foldable display capable of being used in a folded or an unfolded state.

Description of the Related Art

In recent years, portable terminals such as wireless terminals, personal digital assistants (PDAs) and portable multimedia players have decreased in size to improve portability.

However, since users desire to receive information from various sources, such as messages, moving images, still images, audio and games through a screen of a portable terminal, a larger size display is preferable.

Recently, demand for a flexible display, which is capable of operating various applications in addition to easy portability and is capable of displaying an image through a screen larger than that in the portable state has gradually increased.

However, known flexible displays are problematic in that the structure of the flexible display has to compensate for a change in length at an inner side and an outer side of the flexible display, which occurs during folding and unfolding procedures. In such a length compensation structure, because the outer side of a folding hinge is rotated with a larger curvature than the inner side of the folding hinge, change in length occurs in existing structures having the same length at the outer side and the inner side. In order to compensate for the change in length, an additional structure is provided or the entire thickness of the display is increased, which are both problematic solutions.

BRIEF SUMMARY

Accordingly, the present disclosure is directed to a foldable display that substantially obviates one or more problems due to limitations and disadvantages of the related art.

In one or more embodiments of the present disclosure, a foldable display is provided in which a folding region, at which a display panel is folded, is provided with LED arrays or OLED elements so as to eliminate change in length at an outer side and an inner side of the folding region during rotation of a flexible display and to realize display of an image in the folding region.

Additional advantages, objects, and features of the disclosure will be set forth in part in the description which follows and will become apparent to those having ordinary skill in the art upon examination of the following, or may be learned from practice of the disclosure. The advantages of the embodiments of the disclosure may be realized and attained by the structure particularly pointed out in the written description and claims hereof as well as the appended drawings.

To achieve these advantages and in accordance with the purpose of the disclosure, as embodied and broadly described herein, a foldable display includes a lower plate having a folding region which is provided with image sources such as LED arrays or OLEDs so as to display images on all of the folding region and the unfolding regions. There is no change in length at an outer side and an inner side of the folding region due to a hinge of the foldable display.

Furthermore, in one or more embodiments, the lower plate of the foldable display includes first connection holes and second connection holes through which a display panel is easily connected to a printed circuit board.

In one or more embodiments, the foldable display includes a hinge including hinge bodies and hinge links so as to be reliably rotated within a predetermined angular path, thereby ensuring reliable operation.

It is to be understood that both the foregoing general description and the following detailed description of the present disclosure are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
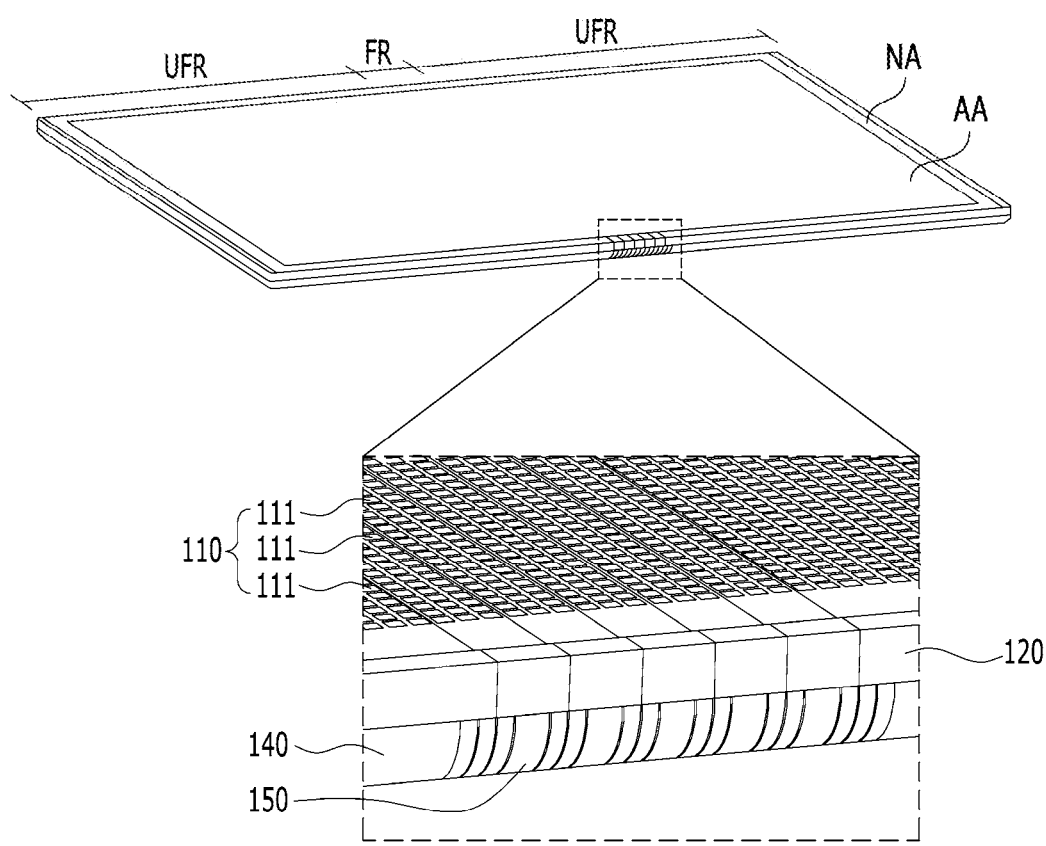
FIG. 1 is a perspective view illustrating a foldable display according to an embodiment of the present disclosure.

Reference will now be made in detail to the preferred embodiments of the present disclosure, examples of which are illustrated in the accompanying drawings. In the drawings, the same or similar elements are denoted by the same reference numerals even when they are depicted in different drawings. In the following description of the present disclosure, a detailed description of known functions or configurations incorporated herein may be omitted when such description may make the subject matter of the present disclosure unclear. Some features illustrated in the drawings are exaggerated, reduced or simplified for convenience of description and clarity, and the drawings and elements in the drawings are not always illustrated at the actual scale. However, these details will be understood by those skilled in the art.

Figure 2:
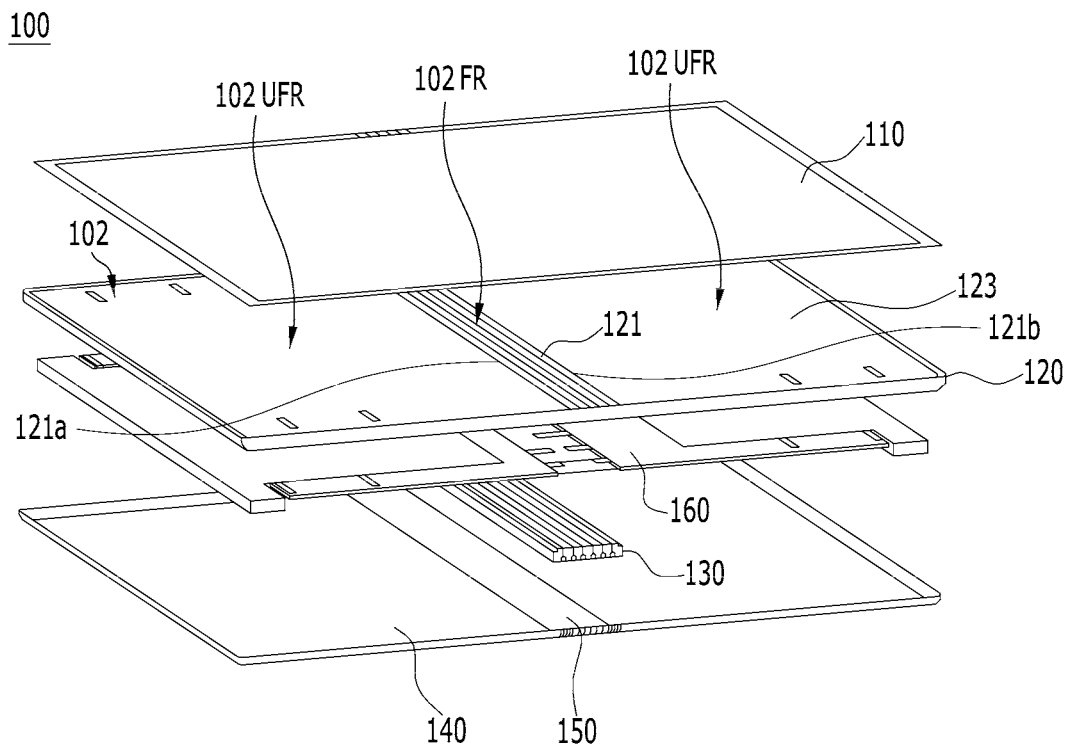
FIG. 2 is an exploded front perspective view of the foldable display of FIG. 1.

FIG. 1 is a perspective view illustrating a foldable display 100 in an assembled state according to an embodiment of the present disclosure. FIG. 2 is an exploded perspective view of the foldable display 100 shown in FIG. 1. The exploded view in FIG. 2 shows the foldable display 100 in a disassembled state.

Referring to FIGS. 1 and 2, the foldable display 100 according to the present disclosure includes a display panel 110, a support plate 120 (which may be referred to herein as a plate 120 or a lower plate 120), a printed circuit board 160 and a hinge 130 (which may be referred to herein as a hinge part 130).

The foldable display 100 is configured to allow at least portions of the display panel 110 for displaying an image to a user and the lower plate 120 to be rotated or folded at a predetermined angle so as to be maintained in the folded state by virtue of the hinge part 130.

In one or more embodiments, the display panel 110 includes a non-active area NA positioned at a peripheral edge of the display panel 100 and an active area AA positioned inside the non-active area, wherein the active area is configured to display an image. In other words, the non-active area NA surrounds the active area AA or the non-active area NA extends along a perimeter of the active area AA. In an embodiment, the display panel 110 is flexible, which allows the display panel 110 to be elastically bent between an unfolded state as in FIG. 1 and a folded state, as described herein.

The display panel 110 includes a plurality of light emitting diode (LED) arrays 111, which are arranged parallel to each other and each of which extends in one direction. In one embodiment, each of the LED arrays 111 includes a plurality of micro-LEDs. The display panel 110 preferably has a rectangular shape, that is, a wide screen shape in which a horizontal length of the display panel 110 is greater than a vertical length of the display panel 110. The display panel 110 is not limited to the above-mentioned shape, and may be configured to have a circular shape or a polygonal shape, in other embodiments. In yet further embodiments, the display panel 110 has an elliptical shape, a triangular shape, a rhombus shape or the like through a folding procedure. Furthermore, the display panel 110 is not limited to including the plurality of LED arrays, but rather, in an alternative embodiment, includes a plurality of organic light emitting diodes (OLEDs). In other words, LEDs or OLEDs can be selected for the display panel 110, which decision may be informed, at least in part, by a size of the active area of the display panel 110.

The lower plate 120 (as well as the foldable display 100) includes at least one folding region FR abutted by two unfolding regions UFR connected to both sides of the folding region FR, as shown in FIG. 1. The lower plate 120 includes a first surface 102, which in an embodiment, is an upper surface of the lower plate 120, as well as a second surface 104, which in an embodiment, is a rear surface of the lower plate 120. The upper surface 102 of the lower plate 120 includes a folding region 102FR between adjacent unfolding regions 102UFR. The rear surface 104 of the lower plate 120 includes a folding region 104FR between adjacent unfolding regions 104UFR that correspond to the folding region 102FR and the unfolding regions 102UFR of the upper surface 102 of the lower plate 120. The display panel 110 is coupled to the upper surface 102 of the lower plate 120, and more specifically, to the folding region 102FR and the unfolding regions 102UFR of the upper surface 102 of the lower plate 120.

The folding region FR of the lower plate 120 includes a plurality of case segments 121 (which may be referred to herein as a plurality of case segments), and the unfolding regions UFR are respectively provided with flat cases 123 disposed at both sides 121a, 121b of the plurality of case segments 121.

The plurality of case segments 121 are an outer folding type that are configured to be folded by virtue of the hinge part 130 coupled to the rear surface 104FR thereof. Since at least one LED array 111 is disposed on the upper surface 102FR of each of the case segments 121, the folding region FR is also able to display an image. Each of the flat cases 123 is provided on the upper surface 102UFR thereof with multiple LED arrays 111, which are arranged parallel to each other and configured to display images in the regions corresponding to the flat cases 123.

In one embodiment, a battery is disposed on the rear surface 104 of the lower plate 120 and connected to the printed circuit board 160 so as to supply power thereto. The printed circuit board 160 may include various electronic components, such as a communication module, a processor, a memory, a sensor module and the like. As such, the battery provides power to the printed circuit board 160 to power the electric components.

First housings 140 are disposed on the rear surfaces 104UFR of the flat cases 123 and a second housing 150 is disposed on the rear surfaces 104FR of the case segments 121. The first housings 140 cover the rear surfaces 104UFR of the unfolding regions UFR, and the second housing 150 covers the rear surface 104FR (which may also be referred to as a plurality of rear surfaces 104FR with each rear surface 104FR corresponding to one of the case segments of the plurality of case segments 121) of the folding region FR. In one embodiment, the second housing 150 is formed from an elastic material, which allows the second housing 150 to be elastically deformed during the folding procedure. In one embodiment, at least one of the first housings 140 and the second housing 150 are provided with a display panel 110 capable of displaying a different image than an adjacent display panel 110, and as such, embodiments of the foldable displays described herein include double-sided displays, or even a display configured to display a plurality of different images.

Figure 3:
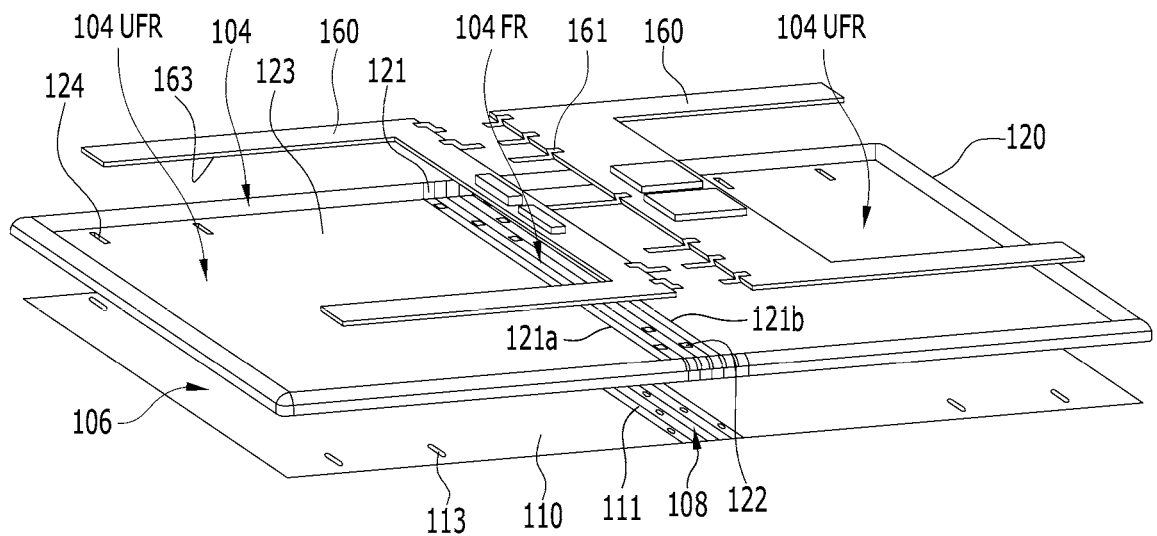
FIG. 3 is an exploded rear perspective view of the foldable display of FIG. 1 illustrating a rear surface of a display panel and a lower plate of the foldable display.
Figure 4:
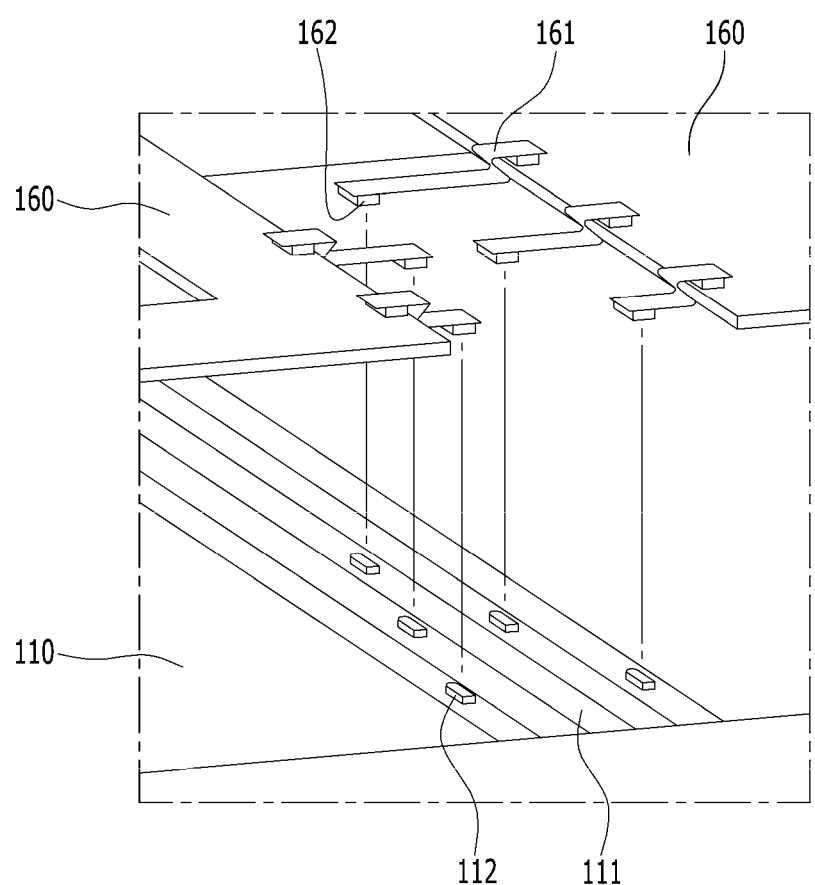
FIG. 4 is an enlarged view of a portion of the foldable display of FIG. 2 illustrating a connected portion of a printed circuit board of the foldable display.

FIG. 3 is a rear perspective view illustrating a surface 106 (which may be referred to herein as a rear surface 106) of the display panel 110 and the rear surface 104 of the lower plate 120 of the foldable display 100 shown in FIG. 2. FIG. 4 is an enlarged view illustrating a connected portion of the printed circuit board 160 of the foldable display 100 shown in FIG. 2. For clarity, the lower plate 120 is not illustrated in FIG. 4.

Referring to FIGS. 3 and 4, the printed circuit board 160 (hereinafter referred to as a PCB) is disposed on the rear surface 104 of the lower plate 120. The PCB 160 is disposed so as to correspond to the rear surfaces 104UFR of the two flat cases 123 in the unfolding regions UFR. More specifically, in one embodiment, the foldable display 100 includes two PCBs 160 with one PCB 160 disposed on the rear surface 104UFR of each flat case 123 of the lower plate 120. A flexible printed circuit board (FPC) 161, which is connected to the two PCBs 160, is disposed on the rear surfaces 104FR of the case segments 121 in the folding region FR. In other words, the FPC 161 corresponds to the rear surfaces 104FR of the plurality of case segments 121 and is connected to the two PCBs on the rear surfaces 104UFR of the flat cases 123.

Each of the LED arrays 111 includes a surface 108 (which may be referred to herein as a rear surface 108) and a first contact 112 (which may be referred to herein as a first connector 112) on the rear surface 108, which is electrically connected to each of the micro LEDs. The FPC 161, which is coupled to the PCB 160, includes a second contact 162 (which may be referred to herein as a second connector 162) connected to the first connector 112. In an embodiment, the first connectors 112 and the second connectors 162 are connected to each other at both sides 121a, 121b of the case segments 121. The case segments 121 include first holes 122 (which may be referred to herein as first connection holes 122), which are formed through the case segments 121 so as to allow the first connectors 112 and the second connectors 162 to be connected to each other through corresponding ones of the first connection holes 122. Alternatively, the first connection holes 122 may not be through holes, and the first connectors 112 and the second connectors 162 may be embodied as other connectors, which are coupled to each other.

The second connectors 162 are configured on the FPC 161 so as to compensate for change in length during folding of the folding region FR. As illustrated in FIG. 4, the second connectors 162 are configured such that they have the folded structure when the display panel is in the unfolded state but they are unfolded when the display panel is folded. Other embodiments include the FPC 161 configured with a different structure for compensating for change in length upon folding of the display panel 110.

The flat cases 123 include second holes 124 (which may be referred to herein as second connection holes 124), which are formed through the flat cases 123 so as to allow the LED arrays 111 disposed in the unfolding region UFR to be connected to a respective PCB 160. The LED arrays 111 disposed in the unfolding regions UFR include third contacts 113 (which may be referred to herein as third connectors 113) on rear surfaces thereof, and the PCB corresponding to the unfolding region UFR includes fourth contacts 163 (which may be referred to herein as fourth connectors 163). Consequently, the third connectors 113 and the fourth connectors 163 are configured to be coupled to each other through the second connection holes 124. In other embodiments, the second holes 124 are configured as other connectors to which the third connectors 113 and the fourth contacts 163 are coupled.

Figure 5A:
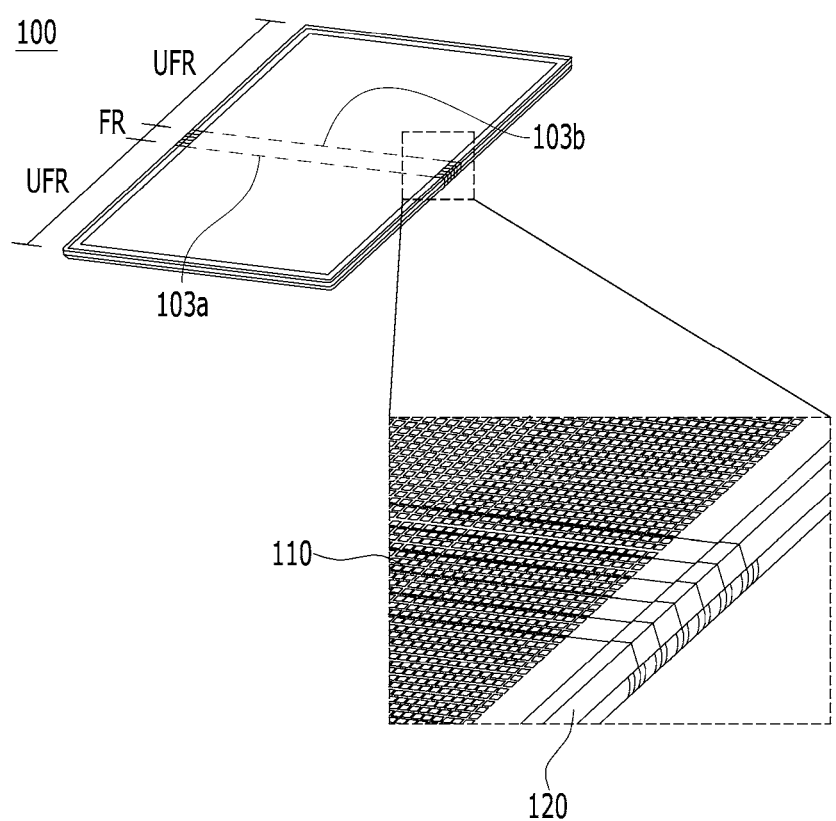
FIG. 5A is an enlarged view illustrating a hinge of the foldable display of FIG. 1 in an unfolded state.
Figure 5B:
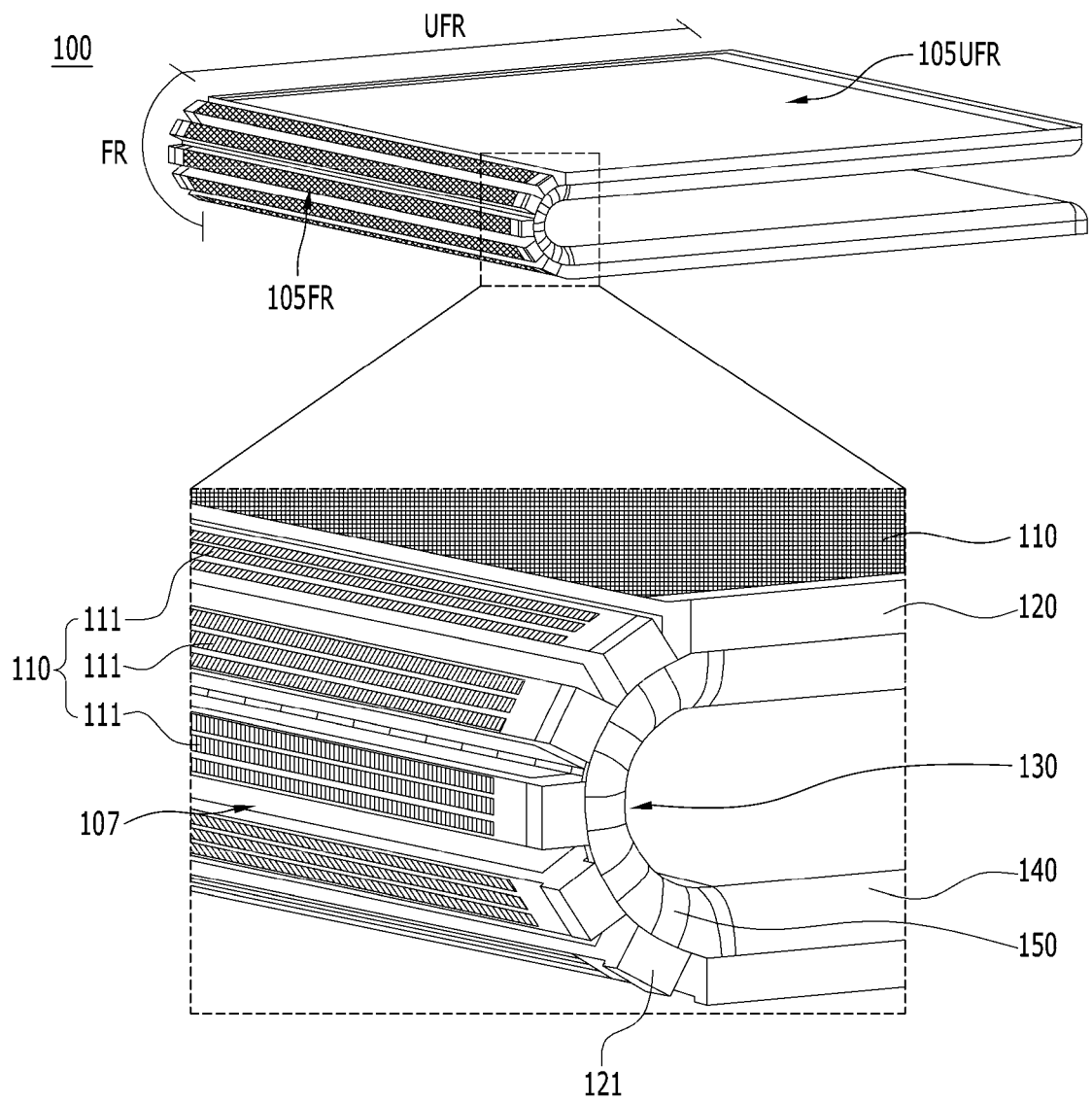
FIG. 5B is an enlarged view of the hinge of the foldable display of FIG. 5A illustrating the foldable display and the hinge in a folded state.
Figure 5C:
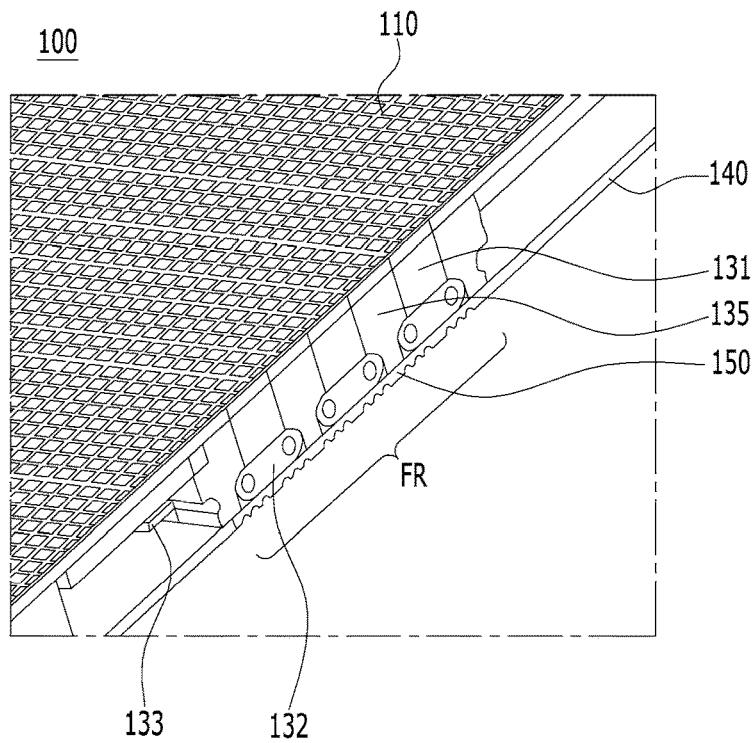
FIG. 5C is a perspective cross-sectional view of the foldable display of FIG. 5A illustrated in the unfolded state.
Figure 5D:
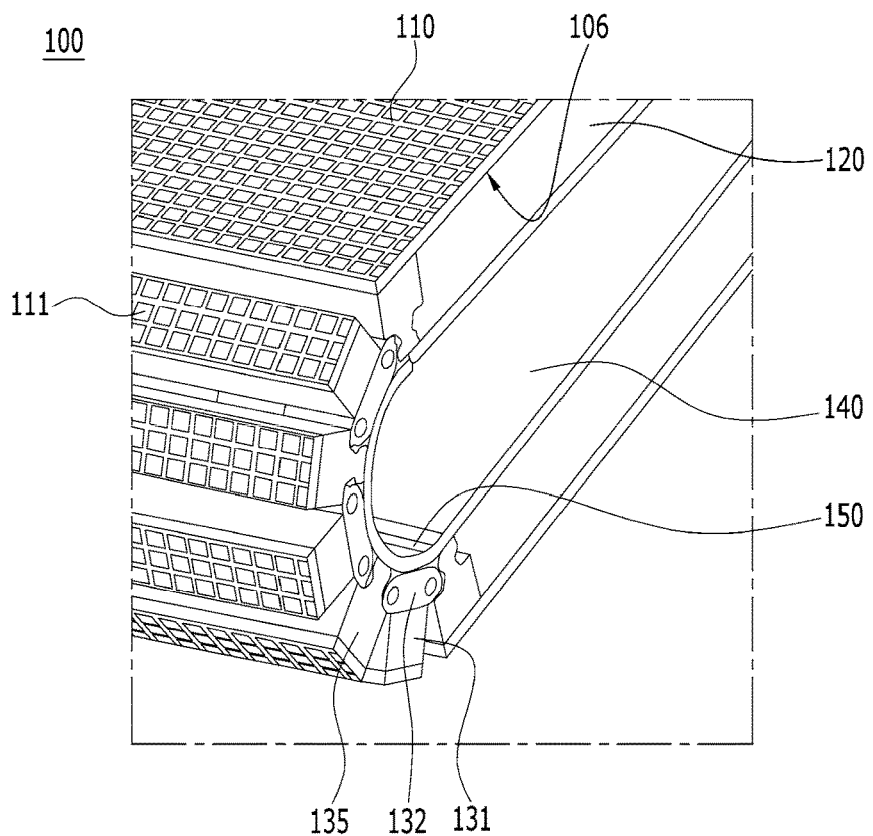
FIG. 5D is a perspective cross-sectional view of the foldable display of FIG. 5B illustrating the foldable display and the hinge in the folded state.
Figure 6A:
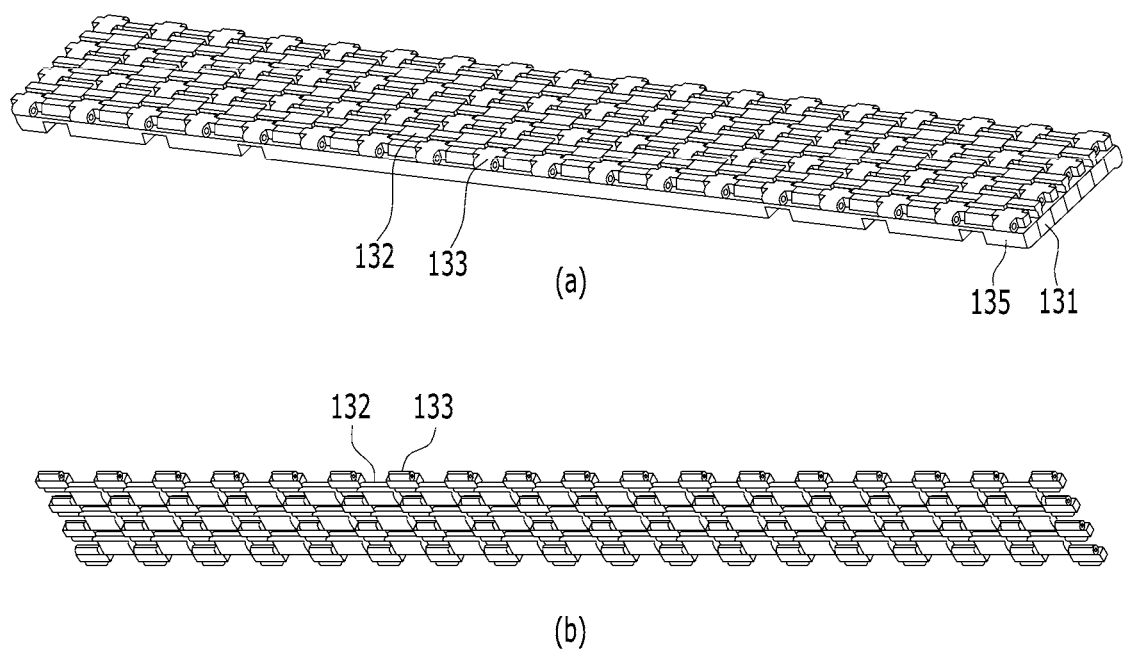
FIG. 6A is a perspective view of the hinge of the foldable display of FIG. 5A in the unfolded state.
Figure 6B:
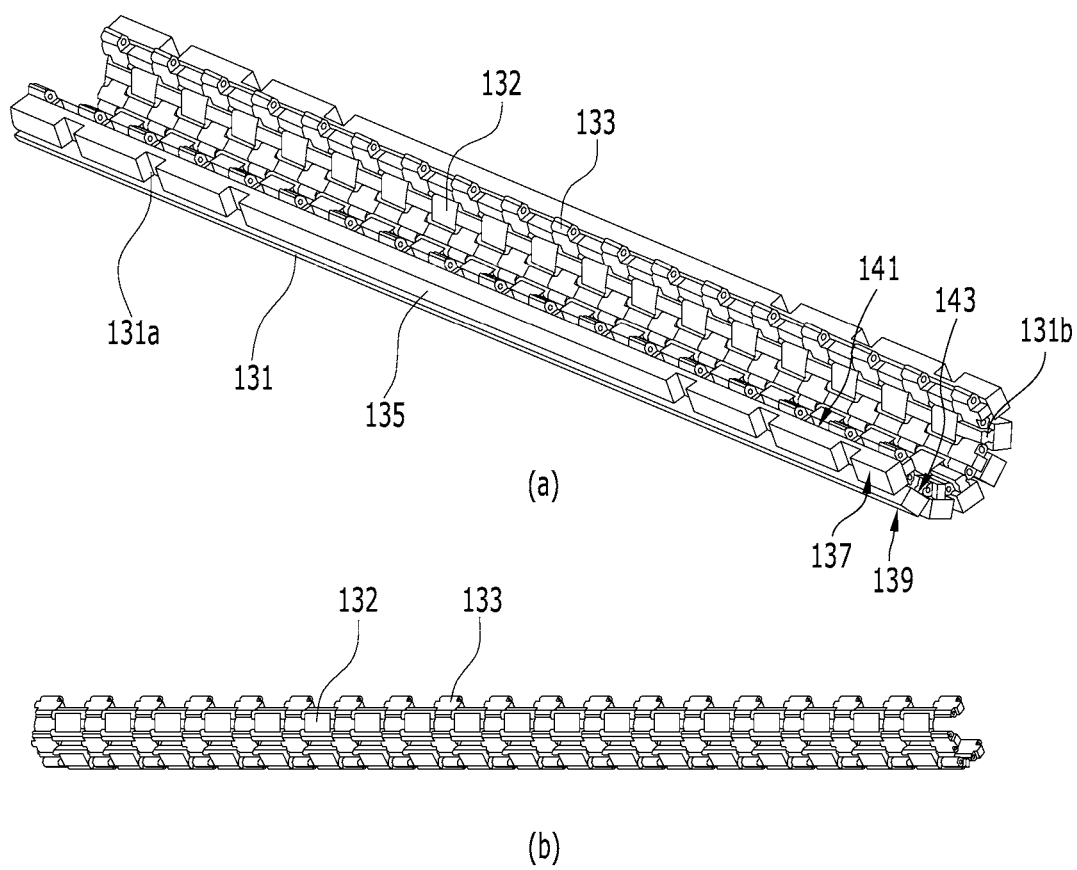
FIG. 6B is a perspective view of the hinge of the foldable display of FIG. 5B in the folded state.
Figure 7:
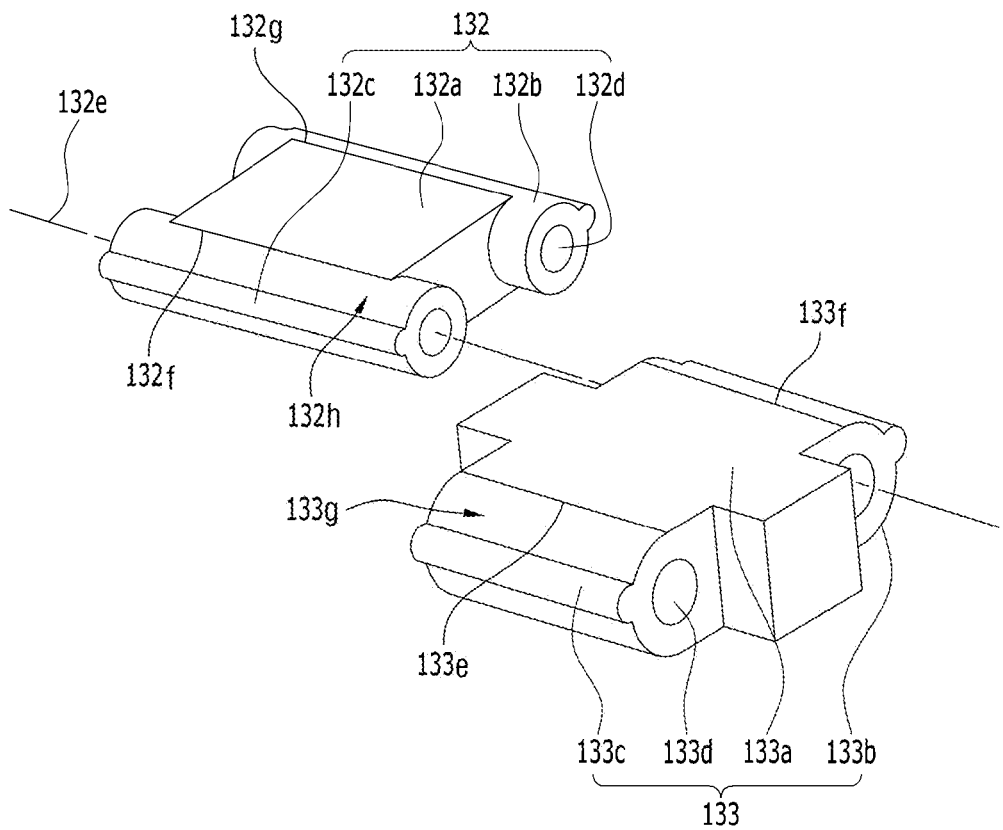
FIG. 7 is an exploded view of a first hinge link and a second hinge link of the foldable display of FIG. 6A.
Figure 8:
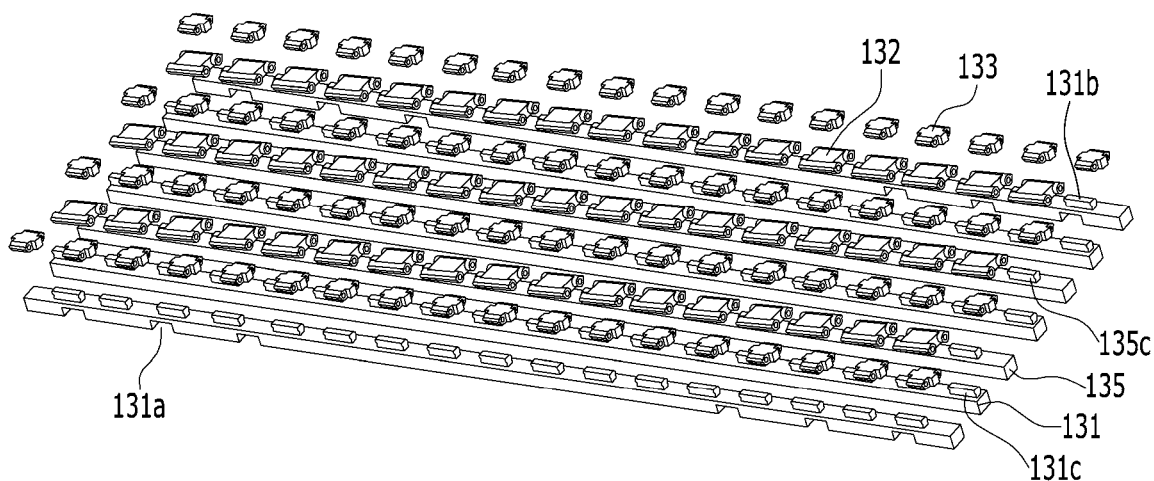
FIG. 8 is an exploded perspective view of the hinge of the foldable display of FIG. 6.
Figure 9:
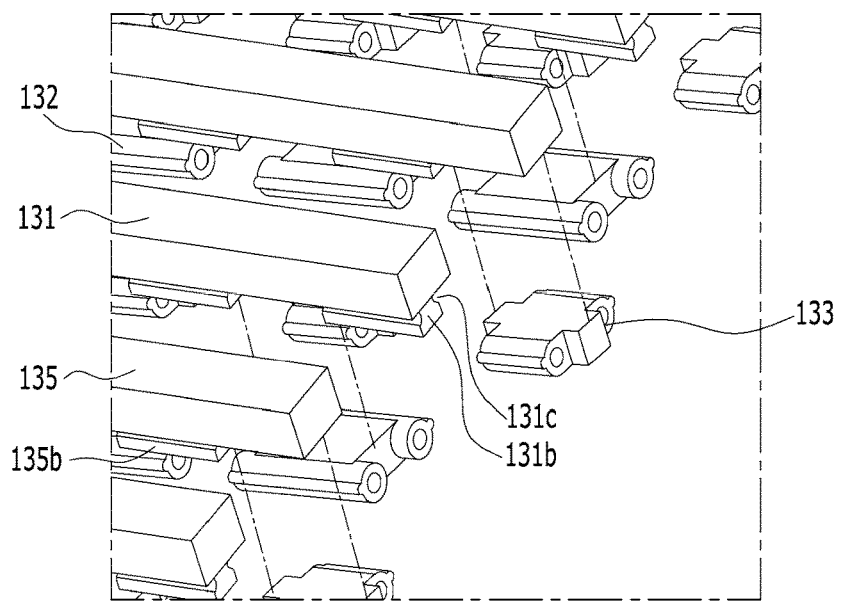
FIG. 9 is an enlarged view of the hinge of FIG. 8.
Figure 10:
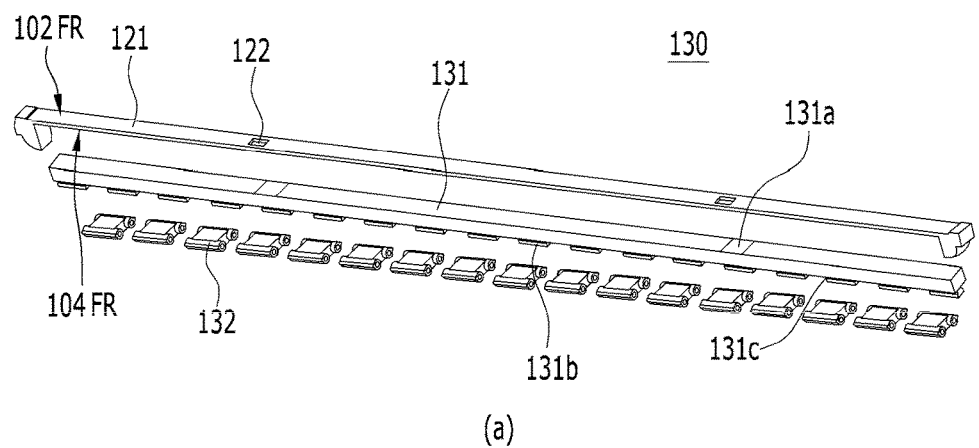
FIG. 10 is an exploded view of a portion of the hinge of FIG. 8.
Figure 10:
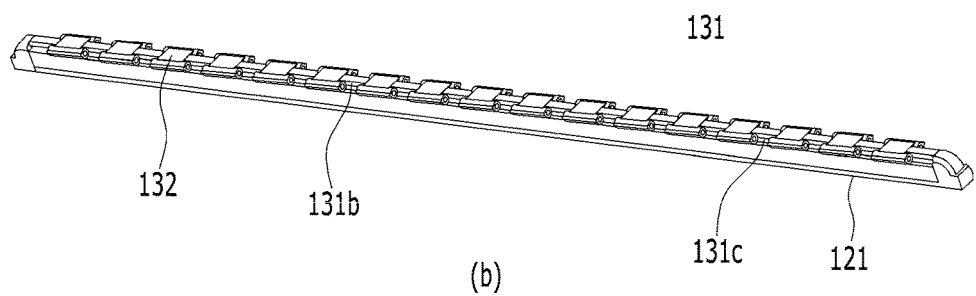

FIG. 5A is an enlarged view of a portion of the foldable display 100 shown in FIG. 1 in the unfolded state. FIG. 5B is an enlarged view of the foldable display 100 of FIG. 5A in the folded state. FIG. 5C is a perspective cross-sectional view of the foldable display 100 shown in FIG. 5A in the unfolded state. FIG. 5D is a perspective cross-sectional view illustrating the foldable display shown of FIG. 5B in the folded state. FIG. 6A is a perspective view illustrating the hinge part 130 of the foldable display 100 shown of FIG. 5A in the unfolded state. FIG. 6B is a perspective view illustrating the hinge part 130 of the foldable display 100 shown in FIG. 5B in the folded state. FIG. 7 is an exploded view illustrating a first hinge link 132 (which may be referred to herein as a first unit hinge 132) and a second hinge link 133 (which may be referred to herein as a second unit hinge 133) of FIG. 6A, which are separated from each other. FIG. 8 is an exploded perspective view illustrating the hinge part 130 of FIG. 6 in a disassembled state. FIG. 9 is an enlarged view of a portion of the hinge part 130 of FIG. 8 in the disassembled state. FIG. 10 is an exploded perspective view of a portion of the hinge part 130 of FIG. 8, which is partially disassembled.

As illustrated in FIG. 5A, the foldable display 100 according to one or more embodiments of the present disclosure is constructed such that the unfolding regions UFR are provided at both sides 103a, 103b of the folding region FR, as indicated by dashed lines in FIG. 5A. The display panel 110, which is constituted by a plurality of OLEDs or LED arrays 111, as above, is disposed on surfaces 105FR and 105UFR (which may be referred to herein as upper surfaces 105FR and 105UFR) of the folding region FR and the unfolding regions UFR, as illustrated in FIG. 5B.

As illustrated in FIG. 5B, as the hinge part 130 is rotated, the folding region FR of the foldable display according to the embodiment of the present disclosure is folded into an approximate "C" shape. In the folding region FR, the LED array 111 disposed on the upper surface 102UFR of each of the case segments 121 becomes spaced apart from adjacent LED arrays 111, thereby creating gaps 107 between adjacent LED arrays 111 due to the rotated angle of the hinge part 130. Accordingly, the foldable display 100 in one embodiment is an outer folding type, wherein in the folded state, the upper surfaces 105UFR of the unfolding regions UFR face in opposite directions. As such, change in length of the display panel 110 does not occur during a folding procedure in outer folding type foldable displays 100, and thus there is no need to provide an additional component for compensating for change in length.

As illustrated in FIG. 5C, in the folding region FR, first hinge bodies 131 and second hinge bodies 135, which are disposed on the rear surface 106 of the display panel 110, are coupled to each other by means of first unit hinges 132 and second unit hinges 133, thereby allowing the folding region FR to be rotated. Consequently, the folding region FR is rotated, and thus the unfolding regions UFR are folded, whereby the rear surfaces of the unfolding regions UFR face each other (e.g. the upper surfaces 105UFR of the unfolding regions UFR face away from each other), as illustrated in FIG. 5D. The detailed structure of the folding region FR is described below with reference to FIGS. 6A through 9.

As illustrated in FIG. 6A, the hinge part 130 includes the hinge bodies 131 and 135, the first unit hinges 132 and the second unit hinges 133.

The hinge bodies 131 and 135, which are coupled to the rear surfaces 104FR of the case segments 121, include first hinge bodies 131 and second hinge bodies 135 connected to adjacent first hinge bodies 131. Since the first unit hinges 132 and the second unit hinges 133 are coupled to each other, the hinge bodies are configured to be folded as illustrated in FIG. 6B.

The case segments 121 are coupled to upper surfaces 137, 139 of the hinge bodies 131 and 135, respectively, and the upper surfaces 137, 139 of the hinge bodies 131 and 135 are provided therein with guide grooves 131a so as not to interfere with the second connectors 162 (see FIG. 4) or the FPCs 161 (see FIG. 4) such that the second connectors 162 are connected to the first connection holes 122 between the rear surfaces 104FR of the case segments 121 and the upper surfaces 137, 139 of the hinge bodies 131, 135.

The guide grooves 131a in one hinge body have a length different from that of the guide grooves 131a in an adjacent hinge body so as to minimize interference with adjacent second connectors 162 or an FPC 161.

Coupling members 131b project or extend from rear surfaces 141, 143 of each of the hinge bodies 131, 135, respectively, and each of the coupling members 131b is provided at both lateral surfaces thereof with interference grooves 131c (see FIG. 8). The coupling members 131b are disposed on the rear surfaces 141, 143 of the hinge bodies 131, 135 in spaced relationship from each other, and the first unit hinge 132 or the second unit hinge 133 is fitted between the coupling members 131b of adjacent bodies 131, 135. As shown more clearly in FIG. 8, the coupling members 131b of each body 131, 135 are in spaced relationship relative to coupling members 131b of each respective body 131, 135 and are offset from coupling members 131b of an adjacent body 131, 135, such that the unit hinges 132, 133 can be received between coupling members 131b of adjacent bodies 131, 135. When the first unit hinge 132 or the second unit hinge 133 is rotated by a predetermined angle, one of the unit hinges 132, 133 may interfere with the interference groove 131c, thereby restricting the rotating angle of the hinge part 130, in an embodiment.

Referring to FIG. 7, the first unit hinge 132 includes a first body 132a, first coupling elements 132b (which may be referred to herein as first coupling members 132b) and first guide protrusions 132c.

The first body 132a is fitted between the coupling members 131b on the rear surface 141 of the first hinge body 131 and is integrally rotated therewith.

The first coupling members 132b project or extend from both sides 132f, 132g of the first body 132a. Each of the first coupling members 132b has a first shaft hole 132d (which may be referred to herein as a first rotating shaft hole 132d) into which a rotating shaft is fitted. The first coupling member 132b is coupled to the second unit hinge 133 such that the second unit hinge 133 is rotated about a rotational axis 132e. The first coupling member 132b has a semicircular or circular outer peripheral surface 132h such that the first coupling member 132b is rotated relative to the second unit hinge 133 coupled thereto without interfering with the second unit hinge 133.

The first guide protrusion 132c projects or extends from the outer peripheral surface 132h of the first coupling member 132b and is disposed in an interference groove 135c (see FIGS. 8 and 9). Accordingly, the first guide protrusion 132c is rotated in the interference groove 135c during the folding procedure. The first guide protrusion 132c comes into contact with the interference groove 135c when the first guide protrusion 132c is rotated by a predetermined angle, thereby restricting the rotating angle, in an embodiment.

The second unit hinge 133 includes a second body 133a, second coupling elements 133b (which may be referred to herein as second coupling members 133b) and second guide protrusions 133c.

The second body 133a is fitted between coupling members 135b on the rear surface 143 of the second hinge body 135, and is integrally rotated therewith.

The second coupling members 133b project from both sides 133e, 133f of the second body 133a. Each of the second coupling members 133b has a second shaft hole 133d (which may be referred to herein as a second rotating shaft hole 133d) into which the rotating shaft is fitted so as to be coupled to the first coupling member 132b. The second coupling member 133b is coupled to the first unit hinge 132 such that the first unit hinge 132 is rotated about the rotational axis 132e. The second coupling member 133b has a semicircular or circular outer peripheral surface 133g such that the second coupling member 133b is rotated relative to the first coupling member 132b coupled thereto without interfering with the first unit hinge 132.

The second guide protrusion 133c projects or extends from the outer peripheral surface 133g of the second coupling member 133b and is disposed in an adjacent interference groove 131c (see FIGS. 8 and 9). Accordingly, the second guide protrusion 133c is rotated in the interference groove 131c during the folding procedure. The second guide protrusion 133c comes into contact with the interference groove 131c when the second guide protrusion 133c is rotated by a predetermined angle, thereby restricting the rotating angle, in an embodiment. In one embodiment, the rotating angle of the second guide protrusion 133c is selected to be equal to the rotating angle of the first guide protrusion 132c. However, in other embodiments, the rotating angle of the second guide protrusion 133c is selected to be different than the rotating angle of the first guide protrusion 132c.

A length of the first body 132a is selected to be equal to a length of the second body 133a, and a length of the first coupling member 132b is selected to be greater than a length of the second coupling member 133b, in an embodiment. In other embodiments, the length of the first body 132a is selected to be different (e.g. greater than or less than) than the length of the second body 133a, and the length of the first coupling member 132b is selected to be equal to or less than the length of the second coupling member 133b.

Referring to FIG. 10, the hinge part 130 is configured such that the hinge body 131 is coupled to the rear surface 104FR of the segment case 121 and the first unit hinges 132 are coupled to the rear surface 141 of the hinge body 131. In this embodiment, the LED array is coupled to the upper surface 102FR of the case segments 121. However, other structures in which the LED array 111 is coupled to the upper surface of the hinge body 131 without the segment case 121 are also contemplated in the present disclosure.

Figure 11:
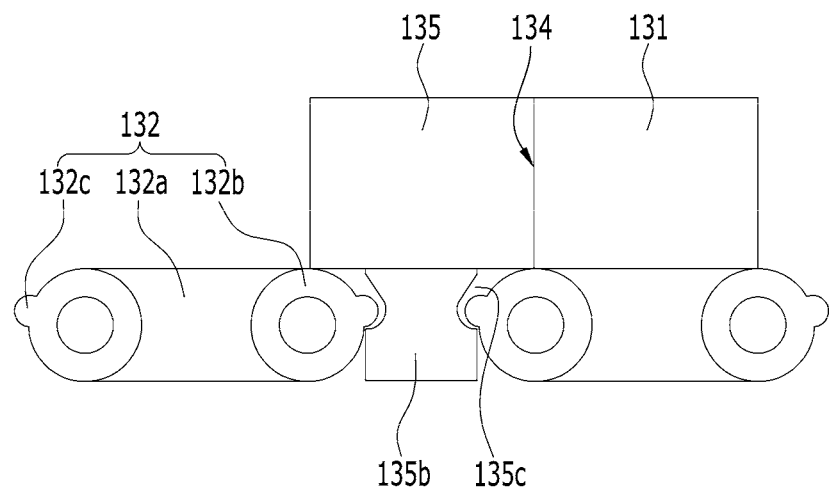
FIG. 11 is a cross-sectional view of the hinge of the foldable display of FIG. 5A in the unfolded state.
Figure 12:
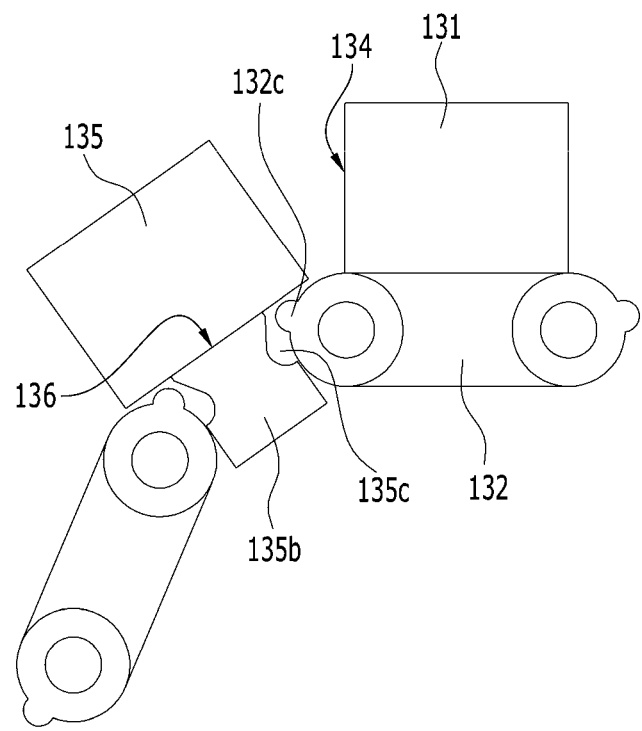
FIG. 12 is a cross-sectional view of the hinge of the foldable display of FIG. 5B in the folded state.

FIGS. 11 and 12 are cross-sectional views illustrating the hinge part 130 of the foldable display 100 shown in FIG. 5B in an unfolded state and in a folded state, respectively.

Referring to FIG. 11, the foldable display 100 according to one or more embodiments of the present disclosure is in the unfolded state. The first guide protrusion 132c coupled to the first hinge body 131 of the first unit hinge 132 is disposed in the interference groove 135c of the second hinge body 135.

When the hinge part 130 is folded as illustrated in FIG. 12, the second hinge body 135, which has been in close contact with a lateral surface 134 of the first hinge body 131, is in spaced relationship with the lateral surface 134 of the first hinge body 131, and the first guide protrusion 132c is rotated in the interference groove 135c in the second hinge body 135 and is brought into contact or interference with a rear surface 136 of the second hinge body 135. Consequently, the first hinge body 131 and the second hinge body 135 are completely rotated. In this way, the hinge bodies 131, 135 are rotated relative to each other, and thus the foldable display 100 is folded within a predetermined range of angles.

Since rotation of the second unit hinge 133 is identical to rotation of the first unit hinge 132, redundant detailed descriptions thereof are omitted.

FIG. 11 further shows the first hinge body 131 fixedly coupled to the first unit hinge 132 and the coupling member 135b extending from the second hinge body 135. The second unit hinge 133 is fixedly coupled to the second hinge body 135 behind the illustrated coupling member 135b (e.g., see FIGS. 8 and 9). As such, a rotating shaft is received in the shaft holes 132d, 133d of the aligned unit hinges 132, 133 to rotatably couple the unit hinges 132, 133 and the hinge bodies 131, 135 to each other.

Figure 13:
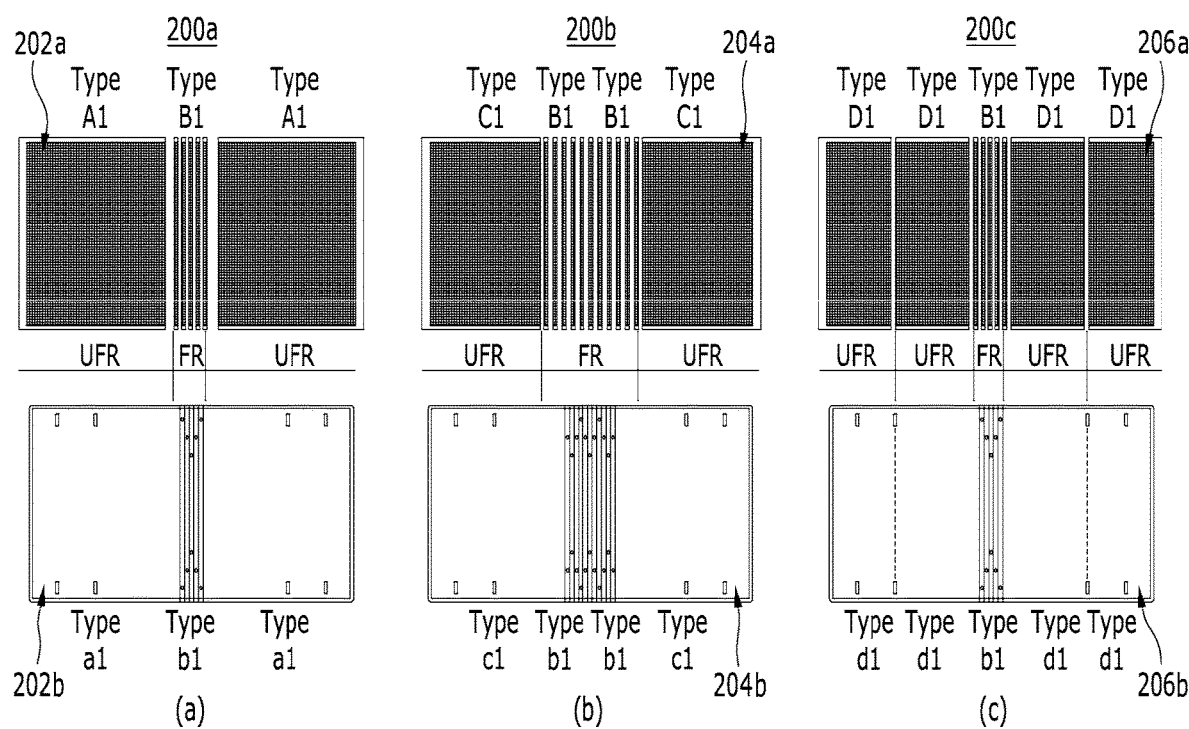
FIG. 13 is a schematic illustration of different arrangements of display panels and lower plates of the foldable display of FIG. 1 according to alternative embodiments of the present disclosure.

FIG. 13 is a schematic illustration of various display panels and lower plates of a foldable display, such as foldable display 100 shown in FIG. 1, wherein the display panels and lower plates have different sizes and are arranged in different configurations. In FIG. 13, an A1-type display panel, a C1-type display panel and a D1-type display panel are the same as the display panel 110 according to one or more embodiments of the present disclosure, which has been described heretofore, with the exception of difference between sizes described with reference to FIG. 13.

FIG. 13(a) is an embodiment of a foldable display 200a in which the foldable display according to the present disclosure has one folding region FR and two unfolding regions UFR and the unfolding regions UFR are rotated with respect to each other about the folding region FR. FIG. 13(a) shows a front surface 202a of the display panel 200a and a rear surface 202b of the display panel 200a. In this example, two A1-type display panels are respectively disposed in the two unfolding regions, and one B1-type display panel is disposed in the folding region of the front surface 202a. In one embodiment, a plurality of OLEDs or LED arrays, each having the same size, are disposed on the B1-type display panel. On the rear surface 202b of the display panel, a1-type flat cases are disposed in the two unfolding regions, and a b1-type segment case is disposed in the B1-type folding region.

As illustrated in FIG. 13(b), the foldable display 200b is constituted by one folding region FR and two unfolding regions UFR and includes a front surface 204a and a rear surface 204b opposite the front surface 204a. However, the size of the folding region FR is increased such that two B1-type display panels are disposed therein so as to control the width of the folding region FR, unlike FIG. 13(a). Accordingly, in the example of FIG. 13(b), two C1-type display panels are disposed at both sides, and two B1-type display panels are disposed in the folding region FR. On the rear surface 204b of the display panel 200b, two c1-type flat cases are respectively disposed in the unfolding regions UFR, and a b1-type segment case is disposed so as to correspond to the two B1-type display panel in the folding region FR. In the example shown in FIG. 13(a), when the foldable display is completely folded, the unfolding regions UFR are disposed so as to correspond to each other. Meanwhile, in the example shown in FIG. 13(b), expansion of the folding region FR offers an advantage of allowing a local region in the folding region FR to be folded such that the display panels in the unfolding regions UFR of the foldable display 200b do not coincide with each other or partially overlap each other.

The foldable display shown in FIG. 13(c) is constituted by one folding region FR and four unfolding regions UFR and includes a front surface 206a and a rear surface 206b opposite the front surface 206a. Here, each of the unfolding regions UFR disposed at both sides may be divided into two or more regions having the same area. Accordingly, two D1-type display panels are disposed at each side, and one B1-type display panel is disposed in the central folding region FR. Here, d1-type flat cases are disposed on the rear surfaces 206b of the D1-type display panels, and a b1-type segment case is disposed on the rear surface 206b of the B1-type display panel. The two d1-type flat cases may be replaced with one a1-type flat case, in an embodiment. Since the division of the unfolding region UFR reduces the size of one display panel 110 to which a plurality of OLEDs or LED arrays 111 are coupled, there is an advantage of enabling only some of the display panels to be replaced or repaired for maintenance.

As is apparent from the above description, the foldable display according to the present disclosure has the following effects.

First, it is possible to display images on all of the folding region and the unfolding regions.

Second, since there is no change in length at outer and inner sides of the foldable display due to rotation of the folding region, there is no need to provide additional components for compensating for the change in length.

Third, it is easy to perform connection of terminals required for operation of the display panels in the folding and unfolding regions.

Fourth, since the hinge part is relatively rotated within a predetermined range of angle, it is possible to ensure stable rotation of the folding region and reliability.

Fifth, since it is possible to manufacture the display panels into various sizes, there is an effect of reducing manufacturing costs.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A foldable display, comprising:
a display panel including a plurality of LED arrays;
a plate including a first surface and a second surface, the plate including at least one folding region with a first side and a second side, the plate further including a first unfolding region connected to the first side of the at least one folding region and a second unfolding region connected to the second side of the at least one folding region, the display panel being coupled to the first surface of the plate;

a printed circuit board coupled to the second surface of the plate and configured to control an operation of the display panel; and a hinge coupled to the at least one folding region and configured to provide folding of the folding region, wherein the plate further includes:

a plurality of case segments in the at least one folding region, each of the plurality of case segments including a first surface and a second surface opposite the first surface, first ones of the plurality of LED arrays being coupled to the first surfaces of each of the plurality of case segments and the hinge being coupled to the second surfaces of each of the plurality of case segments; and a plurality of flat cases in the first unfolding region and the second unfolding region, each flat case including a first surface and a second surface opposite the first surface, a first one of the plurality of flat cases disposed at the first side of the at least one folding region and a second one of the plurality of flat cases disposed at the second side of the at least one folding region, second ones of the plurality of LED arrays being coupled to the first surfaces of the flat cases.

2. The foldable display according to claim 1, wherein a first one of the plurality of case segments includes a connection hole extending through the first one of the plurality of case segments, wherein the connection hole is configured to allow a first connector provided on a surface of a corresponding one of the plurality of LED arrays to be connected through the connection hole to a second connector on a flexible printed circuit board coupled to the printed circuit board.

3. The foldable display according to claim 1, wherein each of the plurality of flat cases include a plurality of connection holes formed through respective ones of the plurality of flat cases, the plurality of connection holes configured to allow the plurality of LED arrays disposed in the unfolding regions to be connected to the printed circuit board through the plurality of connection holes.

4. The foldable display according to claim 2, wherein the hinge further comprises:

a plurality of hinge bodies coupled to the second surfaces of corresponding ones of the plurality of case segments, the plurality of hinge bodies including a first hinge body including a first surface and a second surface opposite the first surface of the first hinge body and a second hinge body including a first surface and a second surface opposite the first surface of the second hinge body, the first hinge body being adjacent to the second hinge body when the hinge is in an unfolded state;

a plurality of first hinge links coupled to the second surface of the first hinge body at predetermined intervals; and a plurality of second hinge links coupled to the second surface of the second hinge body, wherein each of the plurality of second hinge links are coupled to corresponding ones of the plurality of first hinge links.

5. The foldable display according to claim 4, wherein the first hinge body and the second hinge body further include:

a plurality of coupling members disposed on the second surface of each of the first and second hinge bodies and extending from the first and second hinge bodies; and a plurality of interference grooves in each of the plurality of coupling members.

6. The foldable display according to claim 5, wherein each of the plurality of first hinge links further comprises:

a first body secured to the second surface of the first hinge body between a first one and a second one of the plurality of coupling members of the first hinge body, the first body having a first side and a second side opposite the first side;

a plurality of first coupling elements, a first coupling element of the plurality of first coupling elements extending from the first side of the first body and a second coupling element of the plurality of first coupling elements extending from the second side of the first body, each of the plurality of first coupling elements having a first shaft hole configured to receive a rotating shaft; and a plurality of first guide protrusions, each of the plurality of first guide protrusions extending from a corresponding one of the plurality of first coupling elements and configured to restrict rotation of the plurality of first coupling elements.

7. The foldable display according to claim 6, wherein each of the plurality of second hinge links further comprises:

a second body secured to the second surface of the second hinge body between a first one and a second one of the plurality of coupling members of the second hinge body, the second body having a first side and a second side opposite the first side;

a plurality of second coupling elements, a first coupling element of the plurality of second coupling elements extending from the first side of the second body and a second coupling element of the plurality of second coupling elements extending from the second side of the second body, each of the plurality of second coupling element having a second shaft hole configured to receive the rotating shaft to couple the plurality of second coupling members to corresponding ones of the plurality of first coupling members; and a plurality of second guide protrusions, each of plurality of second guide protrusions extending from a corresponding one of the second coupling elements and configured to restrict rotation of the plurality of second coupling elements.

8. The foldable display according to claim 4, wherein each of the plurality of hinge bodies includes a guide groove configured to allow the second connector of the flexible printed circuit board to be disposed between the second surface of the plurality of case segments and the first surface of the plurality of hinge bodies.

9. The foldable display according to claim 1, wherein each of the first and second unfolding regions of the plate include two or more unfolding regions.

10. The foldable display according to claim 1, wherein the plate is an outer folding type configured to allow the display panel to fold such that a first surface of the display panel configured to display images is external relative to a second surface of the display panel opposite the first surface.

11. The foldable display according to claim 1, further comprising:

a plurality of first housings covering the second surfaces of the plurality of flat cases; and a second housing disposed on the second surfaces of the plurality of case segments, wherein the second housing is configured to deform by rotation of the hinge.

12. A foldable display, comprising:

a support plate including a first surface and a second surface opposite the first surface, the support plate including a folding region between a first unfolding region and a second unfolding region;

a display panel on the first surface of the support plate;

a printed circuit board coupled to the second surface of the support plate and electrically connected to the display panel; and a hinge coupled to the folding region, the hinge including:
- a first hinge body coupled to the second surface of the support plate proximate the folding region;
- a second hinge body coupled to the second surface of the support plate proximate the folding region, the second hinge body adjacent the first hinge body when the hinge is in an unfolded state; and
- a plurality of hinge links coupled between the first hinge body and the second hinge body, wherein the support plate further includes:
- a plurality of case segments in the folding region, each of the plurality of case segments including a first surface and a second surface opposite the first surface, first ones of the plurality of LED arrays being coupled to the first surfaces of each of the plurality of case segments and the hinge being coupled to the second surfaces of each of the plurality of case segments; and
- a plurality of flat cases in the first and second unfolding regions, each flat case including a first surface and a second surface opposite the first surface, a first one of the plurality of flat cases disposed at the first side of at least one folding region and a second one of the plurality of flat cases disposed at the second side of the at least one folding region, second ones of the plurality of LED arrays being coupled to the first surfaces of the flat cases.

13. The foldable display of claim 12 wherein the plurality of hinge links includes a first hinge link and a second hinge link, each of the first and second hinge links including at least one coupling element with a shaft hole extending through the at least one coupling element, wherein the shaft hole of the first hinge link and the shaft hole of the second hinge link are configured to receive a shaft and rotate about an axis defined by the shaft.

14. The foldable display of claim 13 wherein each of the at least one coupling elements of the first and second hinge links further includes a protrusion and the second hinge body further includes a first surface opposite a second surface, the protrusion of the first hinge link contacting the second surface of the second hinge body when the hinge is in a folded state.

15. The foldable display of claim 12, further comprising:
- a flexible printed circuit board coupled to the printed circuit board; and
- the support plate further including at least one connection hole, the flexible printed circuit board coupled to the display panel through the at least one connection hole.

16. The foldable display of claim 12 wherein the first hinge body includes a first plurality of coupling members extending from the first hinge body and in spaced relationship relative to each other along the first hinge body and the second hinge body includes a second plurality of coupling members extending from the second hinge body and in spaced relationship relative to each other along the second hinge body, wherein the first plurality of coupling members are aligned with spaces between the second plurality of coupling members.

17. The foldable display of claim 16 wherein each of the first plurality of coupling members further include an interference groove and each of the second plurality of coupling members further include an interference groove.

18. The foldable display of claim 17 wherein the plurality of hinge links includes a first hinge link with a coupling element and a protrusion extending from the coupling element of the first hinge link and a second hinge link including a coupling element and protrusion extending from the coupling element of the second hinge link.

19. The foldable display of claim 18 wherein the protrusion of the first hinge link is received in the interference groove of one of the second plurality of coupling members and the protrusion of the second hinge link is received in the interference groove of one of the first plurality of coupling members.

* * * * *